United States Patent [19]

Shin

[11] Patent Number: 4,465,944

[45] Date of Patent: Aug. 14, 1984

[54] THREE STATE INPUT CIRCUITS

[75] Inventor: Yasuhiro Shin, Tokyo, Japan

[73] Assignee: Oki Electric Industry Co., Ltd., Tokyo, Japan

[21] Appl. No.: 337,860

[22] Filed: Jan. 7, 1982

[30] Foreign Application Priority Data

Jan. 19, 1981 [JP] Japan ................... 56-5110

[51] Int. Cl.$^3$ ................. H03K 19/096; H03K 19/20; H03K 17/693

[52] U.S. Cl. .................. 307/473; 307/289; 307/481; 307/585

[58] Field of Search ........... 307/473, 474, 272 R, 307/481, 289, 291, 582, 585

[56] References Cited

U.S. PATENT DOCUMENTS 4,100,429 7/1978 Adachi ............... 307/473
4,163,907 8/1979 Schroeder et al. ........ 307/473

FOREIGN PATENT DOCUMENTS 0082541 6/1980 Japan ................. 307/473

Primary Examiner—Larry N. Anagnos
Assistant Examiner—David R. Hudspeth
Attorney, Agent, or Firm—Wenderoth, Lind & Ponack

[57] ABSTRACT

The three state input circuit includes a P channel MOS FET and an N channel MOS FET which are supplied with an input signal at their drain electrodes, and a pair of flip-flop circuits connected to source electrodes of respective FETS and acting as a memory. Gate electrodes of the FETs are supplied with timing signals. The circuit operates to sequentially and periodically judge the input states in accordance with the timing signals, and then the stores results of such judgements and then outputs the stored results as 2 bit binary signals.

10 Claims, 10 Drawing Figures

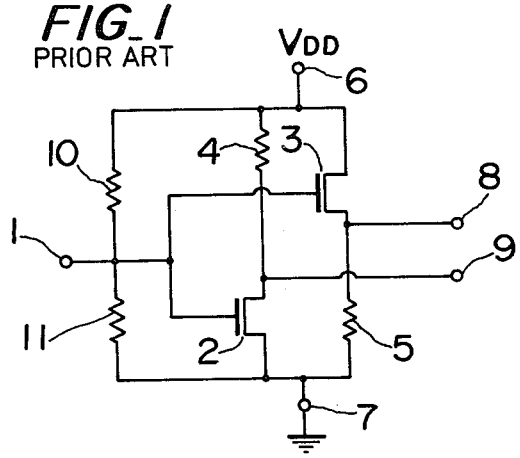
FIG_1 PRIOR ART
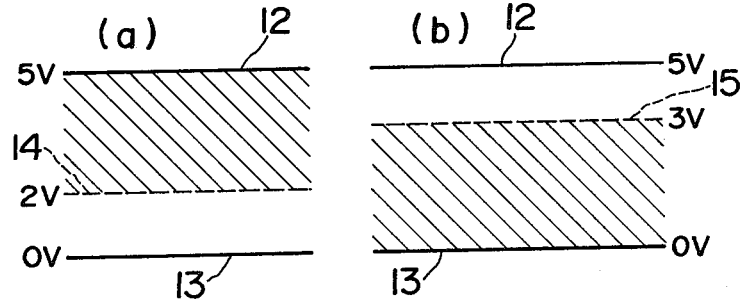
FIG_2 PRIOR ART

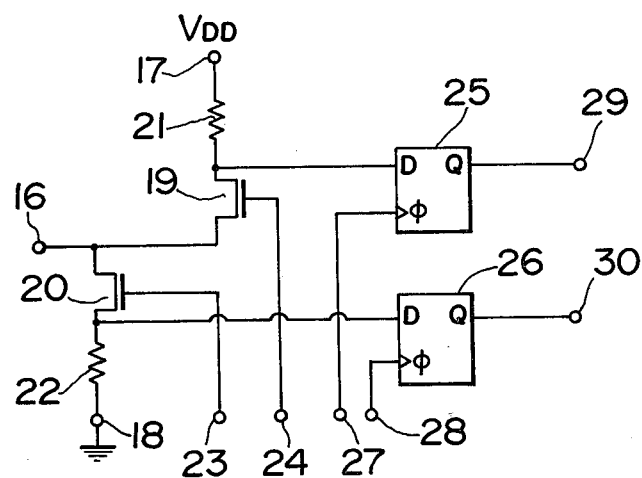
FIG_3
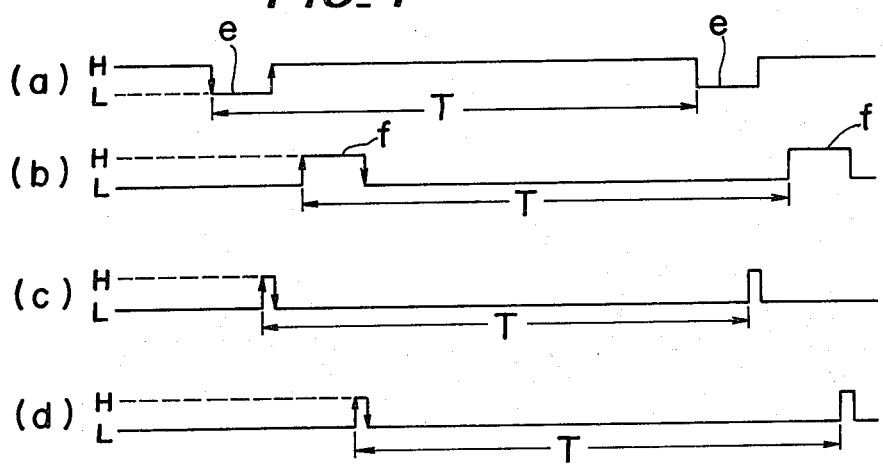
FIG_4

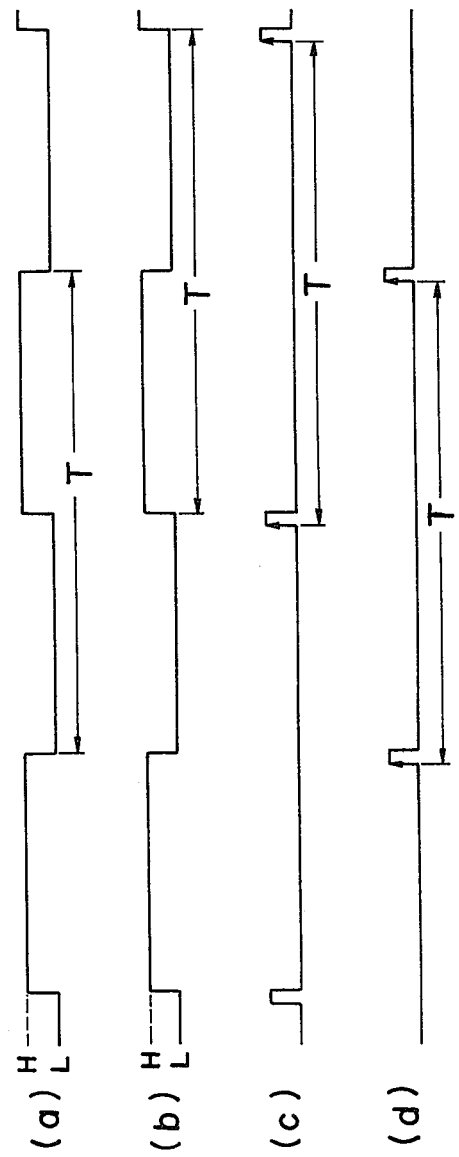

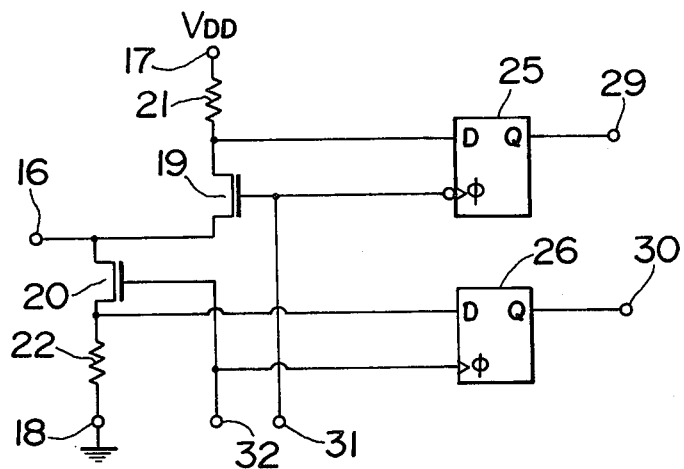
FIG_6
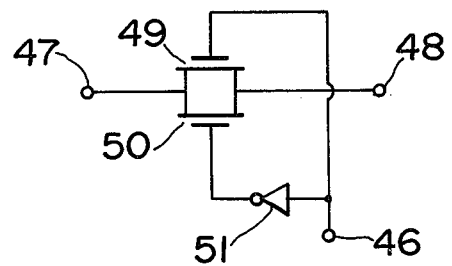
FIG_9

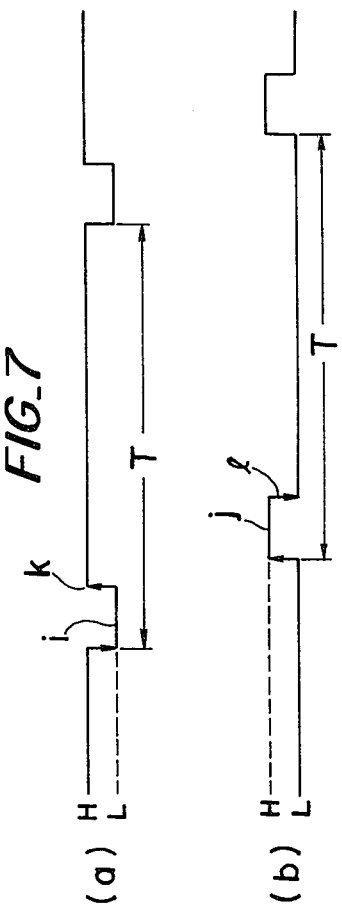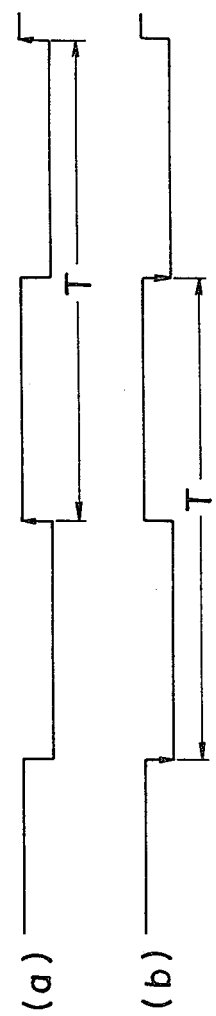

THREE STATE INPUT CIRCUITS

BACKGROUND OF THE INVENTION

This invention relates to a three state input circuit and, more particularly, to a three state input circuit constituting an MOS transistor and capable of operating with a low power consumption.

A three state input circuit is constructed to judge three states, namely, states in which an "L" or "H" level input signal is inputted to its input terminal and a state in which the signal input terminal is "open" for producing a 2 bit binary signal. Since the signal input circuit of this type can decrease the number of terminals of a digital circuit device, it is extremely efficient for designing a high density semiconductor integrated circuit.

A three state input circuit having a prior art C-MOS construction is shown in FIG. 1, which comprises a signal input terminal 1, an N channel MOS FET 2, a P channel MOS FET 3, resistors 4, 5, 10 and 11, an input terminal 6 of a first fixed potential source (for example, a positive potential), an input terminal 7 of a second fixed potential source (for example, a ground potential), a first signal output terminal 8, and a second signal output terminal 9.

The signal input terminal 1 is connected to one end of both resistors 10 and 11 and to the gate electrodes of the N channel MOS FET 2 and the P channel MOS FET 3. The other end of the resistor 10 is connected to the input terminal 6 of the first fixed potential source. To the input terminal 6 are also connected the source electrode of the P channel MOS FET 3 and one end of resistor 4, while the other end thereof is connected to the drain electrode of the N channel MOS FET 2, the drain electrode thereof being connected to the second signal output terminal 9. The drain electrode of the P channel MOS FET 3 is connected to the first signal output terminal 8 and to one end of the resistor 5. The other end of this resistor 5 is connected to the input terminal 7 of the second fixed potential source together with the source electrode of the N channel MOS FET 2, and the other end of the resistor 11.

FIG. 2a is a graph showing a threshold potential 14 (for example, 2 V) with reference to the source potential 12 (for example, 5 V) of the N channel MOS FET 2 and the ground potential 13 (for example, 0 V). As shown in FIG. 2a, the path between the source and drain electrodes of the N channel MOS FET 2 becomes conductive when a potential between the threshold potential 14 and the source potential 12 (shown by a shaded area) is applied to its gate electrode; whereas when a potential less than the threshold potential 14 but higher than the ground potential 13 is applied to the gate electrode the source-drain path becomes nonconductive (OFF).

FIG. 2b is a graph showing a threshold potential 15 (for example, 3 V) with reference to the source potential 12 (for example, 5 V) of the P channel MOS FET 3, and the ground potential 13 (for example, 0 V). As shown by FIG. 2b, the source-drain path of the P channel MOS FET 3 becomes conductive when a potential less than the threshold potential 15 and higher than the ground potential 13 (shown by a shaded area) is applied to its gate electrode, whereas becomes nonconductive when a potential higher than the threshold potential 15 but lower than the source potential 12 is applied to the gate electrode.

The operation of a prior art three state input circuit utilizing P channel MOS FET 3 and N channel MOS FET 2 having characteristics as shown in FIGS. 2a and 2b will now be described in the following.

Assume now that +5 V is applied to the first fixed potential source input terminal 6, that 0 V is applied to the second fixed potential source input terminal 7, and that an L level signal 0 V is applied to the signal input terminal 1. Then, since the gate electrodes of both N and P channel MOS FETs 2 and 3 become 0 V, as can be noted from the characteristics shown in FIGS. 2a and 2b, the source-drain path of the N channel MOS FET 2 becomes nonconductive, while the source-drain path of the P channel MOS FET 3 becomes conductive with the result that the drain electrode of the N channel MOS FET 2 becomes an H level and the drain electrode of the P channel MOS FET 3 also becomes an H level because the resistor 5 acts as a pull-down resistor. The H level signals appear at the output terminals 9 and 8, respectively.

Then, when the signal input terminal 1 becomes an open state, a fractional voltage formed by a voltage divider circuit comprising resistors 10 and 11 would be applied to the signal input terminal 1. Where resistors 10 and 11 have substantially the same resistance values (for example, 10 KΩ-100 KΩ), the divided voltage would be about 2.5 V, and this voltage is applied to the gate electrodes of the N and P channel MOS FETs 2 and 3, respectively. Then, as can be clearly noted from the characteristics shown in FIGS. 2a and 2b, both P and N channel MOS FETs 3 and 2 become conductive, whereby a potential at an L level of the second fixed potential source appears at the drain electrode of the N channel MOS FET 2 and a potential at an H level of the first fixed potential source appears at the drain electrode of the P channel MOS FET 3. These L and H level signals are outputted through the second and the first signal output terminals 9 and 8, respectively.

Upon application of an H level signal (5 V) on the signal input terminal 1, the gate electrodes of the N and P channel MOS FETs 2 and 3 become the H level (5 V), so that as can be noted from the characteristics shown in FIGS. 2a and 2b, the source-drain path of the N channel MOS FET 2 becomes conductive, while the source-drain path of the P channel MOS FET 3 becomes nonconductive. As a consequence, the drain electrode of the N channel MOS FET 2 would be connected to the second fixed potential source to assume the L level. At the same time, the drain electrode of the P channel MOS FET 3 is connected to the second fixed potential source via resistor 5 so that it also becomes the L level and these L level signals are outputted through the second and first signal output terminals 9 and 8.

The input and output relationships described above can be summarized as shown in the following Table I.

TABLE I

| Input level | First signal output terminal | Second signal output terminal |
|---|---|---|
| H | L | L |
| open | H | L |
| L | H | H |

As this table clearly shows the H, open and L level signals inputted to the signal input terminal 1 are decoded into 2 bit binary signals and then outputted.

Above described prior art three state input circuit, however, has the following defects.

(1) Irrespective of the state of the signal input terminal 1, a current always flows through the input circuit so that such input circuit cannot be used for a circuit device consuming low electric power. For example, when the first fixed potential source terminal 6 is at a potential of 6–16 V, a current of several hundred microamperes flows.

(2) For the purpose of decreasing the number of the component parts, resistors 10 and 11 constituting a voltage divider are formed by diffusing a resistive material into the surface of a semiconductor substrate. Actually, however, the values of these resistors do not deviate in the same direction from respective designed values. This causes the divided voltage to vary so that it is difficult to obtain a bias potential for simultaneously turning ON both P and N channel MOS FETs 3 and 2.

(3) As the threshold voltages $V_T$ of the P and N channel MOS FETs 3 and 2 vary depending upon the conditions during manufacturing, it is difficult to correctly match the threshold voltages $V_T$ with the design values. More particularly, the conduction regions of the P channel MOS FET 3 and the N channel MOS FET 2 tend to become narrow, whereby the threshold voltages $V_T$ of the MOS FETs 2 and 3 approach each other. Accordingly, the range in which a judgement is made as to whether the signal input terminal 1 is in an open state or not is restricted, thus causing erroneous operations. Especially, in the prior art circuit it is almost impossible to operate the input circuit with a source voltage of less than 5 V.

SUMMARY OF THE INVENTION

Accordingly, it is an object of this invention to provide an improved three state input circuit that can operate with a lower power consumption, prevent erroneous operations caused by variations in the threshold voltage $V_T$ of the MOS FETs which occur during the manufacturing thereof and can operate stably at a low source voltage of less than 5 V.

Briefly stated, the three state input circuit embodying the invention sequentially and periodically judges the input state according to a timing signal, the result of judgement is stored in memory means and thereafter the stored information is outputted as 2 bit binary signals.

According to this invention, there is provided a three state input circuit comprising a first load means having one terminal coupled to a first fixed potential source, a first switch means coupled between a signal input terminal and another terminal of the first load means and controlled by a second timing signal, a second load means having one terminal coupled to a second fixed potential source, a second switch means coupled between the signal input terminal and another terminal of the second load means and controlled by a first timing signal, a first memory means controlled by a fourth timing signal for selectively storing a potential of the another terminal of the first load means so as to output the potential to a first signal output terminal, and second memory means controlled by a third timing signal for selectively storing a potential of the another terminal of the second load means so as to output the second mentioned potential to a second signal output terminal.

BRIEF DESCRIPTION OF THE DRAWINGS

Further objects and advantages of the invention can be more fully understood from the following detailed description taken in conjunction with the accompanying drawings in which:

FIG. 1 shows a prior art three state input circuit of a C-MOS construction;

FIGS. 2a and 2b are characteristics showing the source potential, the ground potential and the threshold potential of the MOS FETs utilized in the circuit shown in FIG. 1;

FIG. 3 shows a first embodiment of the three state input circuit according to this invention;

FIG. 4 shows waveforms of the timing signals utilized in the circuit shown in FIG. 3;

FIG. 5 shows waveforms illustrating other examples of the timing signals;

FIG. 6 is a connection diagram showing a second embodiment of this invention;

FIG. 7 shows waveforms of the timing signals utilized in the circuit shown in FIG. 6;

FIG. 8 shows waveforms of the other timing signals utilized in the circuit shown in FIG. 6; and FIG. 9 shows a connection diagram of a C-MOS analogue switch.

DESCRIPTION OF THE PREFERRED EMBODIMENTS

A first embodiment of this invention shown in FIG. 3 comprises a signal input terminal 16, a first fixed potential source input terminal 17 (for example, a positive potential), a second fixed potential source input terminal 18 (for example, a ground potential), a P channel MOS FET 20 acting as a first switch means, an N channel MOS FET 19 acting as a second switch means, a resistor 21 acting as a first load means, a resistor 22 acting as a second load means, a second timing signal input terminal 24, a first timing signal input terminal 23, a data flip-flop circuit 25 acting as first means for temporarily storing a signal potential level, a data flip-flop circuit 26 acting as second means for temporarily storing a signal potential level, a third timing signal input terminal 28, a fourth timing signal input terminal 27, a first signal output terminal 29, and a second signal output terminal 30.

One end of the resistor 21 is connected to a first fixed potential source input terminal 17. The drain electrode of the N channel MOS FET 19 is connected to the signal input terminal 16, while its source electrode is connected to the other end of the resistor 21. The gate electrode of the MOS FET 19 is connected to the second timing signal input terminal 24. One end of the resistor 22 is connected to the second fixed potential source input terminal 18. The drain electrode of the P channel MOS FET 20 is connected to the signal input terminal 16 and its source electrode is connected to the other end of the resistor 22, whereas the gate electrode is connected to the first timing signal input terminal 23. The other end of the resistor 21 is connected to the data input terminal D of the data flip-flop circuit 25. The clock signal input terminal $\phi$ thereof is connected to the fourth timing signal input terminal 27, while the output terminal Q is connected to the first signal output terminal 29. The other end of the resistor 22 is connected to the data input terminal D of the data flip-flop circuit 26. The clock signal input terminal $\phi$ thereof is connected to the third timing signal input terminal 28, and its output terminal Q is connected to the second output terminal 30.

FIGS. 4a through 4d show a timing signal having a period T and applied to the first through the fourth timing signal input terminals 23, 24, 28 and 27. The first timing signal shown in FIG. 4a is inputted to the first timing signal input terminal 23, the second timing signal shown in FIG. 4b is applied to the second timing signal input terminal 24, the third timing signal shown in FIG. 4c is applied to the third timing signal input terminal 28, and the fourth timing signal shown in FIG. 4d is applied to the fourth timing signal input terminal 27.

The operation of the three state input circuit shown in FIG. 3 will now be described hereunder with reference to waveforms shown in FIGS. 4a through 4d.

Assume now that +5 V is applied to the first fixed potential source input terminal 17, and assume that 0 V is applied to the second fixed potential source input terminal 18 and assume that the timing signals shown in FIG. 4a–FIG. 4d and having a period T are applied to the first to fourth timing signal input terminals 23, 24, 28 and 27. Furthermore, it is assumed that an L level (0 V) potential is applied to the signal input terminal 16 and it is assumed, that an H level signal is applied to the first timing signal input terminal 23, and it is assumed that an L level signal is applied to the second to fourth timing signal input terminals 24, 28 and 27. Accordingly, both the N channel MOS FET 19 and the P channel MOS FET 20 become OFF so that the data input terminal D of the data flip-flop circuit 25 becomes an H level and the data input terminal of the data flip-flop circuit 26 becomes an L level. When the first timing signal input terminal 23 changes from the H level to the L level (interval e shown in FIG. 4), the P channel MOS FET 20 turns ON to maintain the data input terminal D of the data flip-flop circuit 26 at the L level.

Immediately before the first timing signal changes from the L level to an H level to again turn OFF the P channel MOS FET 20, when the third timing signal is applied to the clock signal input terminal φ of the data flip-flop circuit 26, the signal level at the data input terminal D is stored at the time of building up of the third timing signal so that an L level signal is outputted from the second signal output terminal 30.

When the first timing signal input terminal 23 becomes the H level, the P channel MOS FET 20 is turned OFF again.

As the second timing signal changes from the L to the H level (interval f shown in FIG. 4b) the N channel MOS FET 19 turns ON so that the data input terminal D of the data flip-flop circuit 25 because an L level.

Immediately before the second timing signal changes from the H to an L level to again turn OFF the N channel MOS FET 19, when the fourth timing signal is applied to the clock signal input terminal φ of the data flip-flop circuit 25, the signal level at the data input terminal is stored at the time of building up of the fourth timing signal so that an L level signal appears at the first signal output terminal 29.

Accordingly, when an L level signal is inputted to the signal input terminal 16, both the first and second signal output terminals 29 and 30 become an L level.

When the signal input terminal 16 is open, the circuit operates as follows.

When the H level signal is inputted to the first timing signal input terminal 23 while the L level signals are inputted to the second to fourth timing signal input terminals 24, 28 and 27, both P and N channel MOS FETs 20 and 19 are turned OFF so that the data input terminals D of the flip-flop circuits 25 and 26 respectively become an H level and an L level.

As the first timing signal changes from the H to L level, the P channel MOS transistor 20 is turned ON but since the signal input terminal 16 is open, the data input terminal of the data flip-flop circuit 26 is continuously maintained at the L level. Thus, immediately before the P channel MOS FET 20 again turns OFF, an L level signal appears at the second signal output terminal at the time of building up of the third timing signal.

When the first timing signal input terminal 23 is at the H level, the P channel MOS FET 20 is OFF. Thereafter, when the second timing signal input terminal 24 changes from the L level to the H level, the N channel MOS FET 19 becomes conductive. Then, immediately before again turning OFF the N channel MOS FET 19, when the fourth timing signal is inputted to the clock signal input terminal φ of the data flip-flop circuit 25, the data at the data input terminal D would be stored at the time of building up of the fourth timing signal so that an H level signal appears at the first signal output terminal 29.

Thus, so long as the signal input terminal 16 is open, the first and second signal output terminals 29 and 30 become an H level and an L level, respectively.

Then, it is assumed that an H level signal is inputted to the signal input terminal 16, and it is assumed that the first timing signal input terminal 23 is at the H level and it is assumed that the second through fourth timing signal input terminals 24, 28 and 27 are at the L level.

Then, both the P channel MOS FET 20 and the N channel MOS FET 19 turn OFF so that the data input terminal D of the data flip-flop circuit 25 becomes an H level, while the data input terminal D of the data flip-flop circuit 26 becomes an L level.

When the first timing signal input terminal 23 changes from the H level to the L level, the P channel MOS FET 20 becomes conductive so that the data input terminal D of the data flip-flop circuit 25 becomes an H level.

Immediately before again turning OFF the P channel MOS FET 20 and when the third timing signal is applied to the clock signal input terminal φ of the data flip-flop circuit 26, an H level signal appears at the second signal output terminal 30 when the third timing signal builds up.

When the second timing signal input terminal 24 becomes an H level, the N channel MOS FET 19 turns ON so that the data input terminal D of the data flip-flop circuit 25 becomes an H level. Then, immediately before the N channel MOS FET 19 again turns OFF and when the fourth timing signal is inputted to the clock signal input terminal φ of the data input flip-flop circuit 25, an H level signal appears at the first signal output terminal at the time of building up of the fourth timing signal.

Accordingly, as an H level signal is inputted to the signal input terminal 16, both the first and second signal output terminals 29 and 30 become an H level.

The input-output relationships described above can be summarized as shown in the following Table II.

TABLE II

| Input level | First signal output terminal | Second signal output terminal |
|---|---|---|
| H | H | H |
| "open" | H | L |
| L | L | L |

As can be clearly noted from this table, H, "open" and L signals inputted to the signal input terminal 16 are decoded and outputted through two signal output terminals 29 and 30.

In the first embodiment described above, it is necessary to complete the judging operation of the state of one of the input terminals.

Although in the foregoing description, the operation of the three state input circuit was described by using the timing signals shown in FIGS. 4a through 4d, it is possible to operate the circuit such that both MOS FETs 19 and 20 would not become OFF at the same time, by using the timing signals shown in FIGS. 5a through 5d, that is, the first and second timing signals are arranged such that the H levels and the L levels are switched at the same phase as shown in FIGS. 5a and 5b, and the third and fourth timing signals shown in FIGS. 5c and 5d arranged so as to be synchronous with the timing signals shown in FIGS. 5a and 5b.

Although in the first embodiment, the timing signal applied to the gate electrodes of the MOS FETs and the timing signal applied to the data flip-flop circuits were not the same, it is possible to use a single timing signal instead of two timing signals.

FIG. 6 shows a second embodiment of this invention in which the gate electrode of the N channel MOS FET 19 and the clock signal input terminal $\phi$ of the data flip-flop circuit 25 are connected to a common timing signal input terminal 31 (for convenience, called a first timing signal input terminal). In the same manner, the gate electrode of the P channel MOS FET 20 and the clock signal input terminal $\phi$ of the data flip-flop circuit 26 are connected to a common timing signal input terminal 32 (for convenience, called a second timing signal input terminal). The other connections are similar to those of the first embodiment shown in FIG. 3, provided that in the second embodiment, clock signal input terminal $\phi$ is used with data flip-flop circuit 25 having an inverter function.

FIGS. 7a and 7b show timing signals having a period T and inputted to the first and second timing signal input terminals 32 and 31. The timing signal (for convenience, called a first timing signal) shown in FIG. 7a is applied to the first timing signal input terminal 32, while the timing signal shown in FIG. 7b (for convenience, called a second timing signal) is applied to the second timing signal input terminal 31.

The operation of the second embodiment will now be described with reference to the waveforms shown in FIGS. 7a and 7b.

In FIG. 6, when an L level signal (interval i shown in FIG. 7a) is applied to the first timing signal input terminal 32 and when an L level signal (FIG. 7b) is applied to the second timing signal input terminal 31, the P channel MOS FET 20 becomes ON, while the N channel MOS FET 19 becomes OFF so that the data input terminal D of the data flip-flop circuit 26 becomes a H level when the signal input terminal 16 is at the H level but becomes an L level when the signal input terminal 16 is at the L level or in an open state.

Then, when the first timing signal changes from the L level to the H level (at k in FIG. 7a), concurrently with the turning OFF of the P channel MOS FET 20, the signal at the data input terminal D of the data flip-flop circuit 26 would appear at the second signal output terminal 30. In this case, since the variation in the gate signal of the P channel MOS FET 20 is delayed several ns and is then applied to the data input terminal D, it is possible to positively store in the data flip-flop circuit 26 the signal level at the data input terminal D immediately before turning OFF the P channel MOS FET 20.

In the same manner, when an H level signal is inputted to the first timing signal input terminal 32 and an H level signal (interval j shown in FIG. 7b) is inputted to the second timing signal input terminal 31, the P channel MOS FET 20 turns OFF and the N channel MOS FET 19 turns ON with the result that the data input terminal D of the data flip-flop circuit 25 becomes an L level when the signal input terminal 16 is at the L level, whereas the data input terminal D becomes an H level or an open state when the signal input terminal 16 is at the H level.

When the second timing signal changes from the H to an L level (at l shown in FIG. 7b), after the signal at the data input terminal D of the data flip-flop circuit 25 has appeared at the first signal output terminal 29, the N channel MOS FET 19 turns OFF.

As described above the second embodiment operates in the same manner as the first embodiment so that the relationship between input and output is the same as that shown in Table II.

The first and second timing signals utilized in the second embodiment may be of the same phase as shown in FIGS. 8a and 8b. With these signals, the three state input circuit operates in the same manner as described above.

Although in both the first and second embodiments, a P channel MOS FET and an N channel MOS FET were used as the switch means, it will be clear with the switch means are not limited to these MOS FETs. For example, FIG. 9 shows a C-MOS analogue switch comprising a P channel MOS FET 50, an N channel MOS FET 49 and an inverter 51. This C-MOS analogue switch can also be used as the switch means. In the C-MOS analogue switch, in response to a timing signal inputted to the signal input terminal 46, a path between signal input terminal 47 and the signal output terminal 48 becomes selectively conductive or nonconductive.

The three state input circuits illustrated in the foregoing embodiments have the following advantages.

(1) It is not necessary to provide a resistive voltage divider which has been necessary in the prior art circuit for judging the open state of the input. Moreover, in the circuit of this invention, two switch means do not turn ON simultaneously, so that it can operate at an extremely low power consumption which is on the order of several tens microwats. Although in this invention it is necessary to use a data flip-flop circuit acting as a memory means and a timing signal generating circuit, since these circuit elements are constituted by a C-MOS gate circuit, they consume only a small current which is on the order of several tenths of nA. This does not significantly increase the power consumption of the input circuit as a whole. Furthermore, where the ON times of the two switch means in one period are shortened, it is possible to further decrease the average power consumption. (2) In the circuit of this invention, as it is not necessary to set the threshold voltage $V_T$ of the switch means to a strict value, the circuit is less influenced by voltage variations so that it can be used at a voltage of about one half (3–16 V) of the operating voltage of the prior art circuit. Moreover, it is possible to widen the range of the operating voltage. Accordingly, it is possible to greatly increase the percentage of satisfactory products (i.e.—the manufacturing yield). The three state input circuit has many applications in a large integrated circuit requiring a decrease in the number of terminals. However, it is most suitable for use as an input circuit for setting the operation parameters of an electronic time keeper.

What is claimed is:

1. A three state input circuit comprising:
   a first load means having two terminals, one of which is coupled to a first fixed potential source;
   a first switch means coupled between a signal input terminal and the other terminal of said first load means and controlled by a second timing signal;
   a second load means having two terminals, one of which is coupled to a second fixed potential source;
   a second switch means coupled between said signal input terminal and the other terminal of said second load means and controlled by a first timing signal;
   a first memory means controlled by a fourth timing signal for selectively storing a first signal potential level of said other terminal of said first load means so as to output said signal potential level to a first signal output terminal; and
   a second memory means controlled by a third timing signal for selectively storing a second signal potential level of said other terminal of said second load means so as to output said second signal potential level to a second signal output terminal;
   wherein said circuit sequentially and periodically operates such that in response to said first and second timing signals, said circuit sequentially and periodically closes one of said first and second previously open switch means, then opens said one switch means, then closes the other of said first and second switch means, then opens said other switch means.

2. A three state input circuit comprising:
   a first load means having two terminals, one of which is coupled to a first fixed potential source;
   a first switch means coupled between a signal input terminal and the other terminal of said first load means and controlled by a second timing signal;
   a second load means having two terminals, one of which is coupled to a second fixed potential source;
   a second switch means coupled between said signal input terminal and the other terminal of said second load means and controlled by a first timing signal;
   a first memory means controlled by a fourth timing signal for selectively storing a first signal potential level of said other terminal of said first load means so as to output said signal potential level to a first signal output terminal; and
   a second memory means controlled by a third timing signal for selectively storing a second signal potential level of said other terminal of said second load means so as to output said second signal potential level to a second signal output terminal;
   wherein said circuit sequentially and periodically operates, in response to said first and second timing signals, such that it first closes one of said switch means and opens the other of said previously closed switch means and then closes said one open switch means and leaves closed said other switch means.

3. A three state input circuit comprising:
   a high and a low fixed potential source;
   a signal input terminal for receiving a three-state signal having a low level, a high level, and an open floating level;
   first and second output terminals;
   a first load means having two terminals, one of which is coupled to said high fixed potential source;
   a second load means having two terminals, one of which is coupled to said low fixed potential source;
   an N-channel MOSFET having a source electrode coupled to the other terminal of said first load means, a drain electrode coupled to said signal input terminal, and a gate electrode connected to receive a second timing signal;
   a P-channel MOSFET having a drain electrode coupled to said signal input terminal, a source electrode coupled to the other terminal of said second load means, and a gate electrode connected to receive a first timing signal which has the same period as said second timing signal and is out of phase with said first timing signal;
   a first memory means for temporarily storing a signal potential level of said source electrode of said N-channel MOSFET in accordance with a fourth timing signal which is received during the presence of said second timing signal and for sending one bit of a two-bit binary signal corresponding to said input signal to said first output terminal; and
   a second memory means for temporarily storing a signal potential level of said source electrode of said P-channel MOSFET by a third timing signal which is received during the presence of said first timing signal and for sending the other bit of said binary signal to said second terminal;
   whereby said N- and P-channel MOSFETs operate so as not to change their conduction states at the same time.

4. A three state input circuit according to claim 3, wherein said first memory means comprises a first data flip-flop circuit which comprises CMOS gates, and said second memory means comprises a second data flip-flop circuit which comprises CMOS gates.

5. A three state input circuit according to claim 3, further comprising a second P-channel MOSFET connected in parallel to said N-channel MOSFET so as to operate as a CMOS analogue switch and controlled by said second timing signal, and a second N-channel MOSFET connected in parallel to said P-channel MOSFET so as to operate as a CMOS analogue switch and controlled by said first timing signal.

6. A three state input circuit according to claim 5, wherein said first memory means comprises a first data flip-flop circuit which comprises CMOS gates, and said second memory means comprises a second data flip-flop circuit which comprises CMOS gates.

7. A three state input circuit comprising:
   a high and a low fixed potential source;
   a signal input terminal for receiving a three-state signal having a low level, a high level, and an open floating level;
   first and second output terminals;
   a first load means having two terminals, one of which is coupled to said high fixed potential source;
   a second load means having two terminals, one of which is coupled to said low fixed potential source;
   an N-channel MOSFET having a source electrode coupled to the other terminal of said first load means, a drain electrode coupled to said signal input terminal, and a gate electrode connected to receive a second timing signal;
   a P-channel MOSFET having a drain electrode coupled to said signal input terminal, a source electrode coupled to the other terminal of said second load means, and a gate electrode connected to receive a first timing signal which has the same period as said first timing signal and is out of phase with said first timing signal;

a first memory means for temporarily storing a signal potential level of said source electrode of said N-channel MOSFET in accordance with said second timing signal and for sending one bit of a two-bit binary signal corresponding to said input signal to said first output terminal; and a second memory means for temporarily storing a signal potential level of said source electrode of said P-channel MOSFET in accordance with said first timing signal and sending the other bit of said binary signal to said second output terminal;

whereby said N- and P-channel MOSFETs operate so as not to turn ON and OFF at the same time.

8. A three state input circuit according to claim 7, wherein said first memory means comprises a first data flip-flop circuit which comprises CMOS gates, and said second memory means comprises a second data flip-flop circuit which comprises CMOS gates.

9. A three state input circuit according to claim 7, further comprising a second P-channel MOSFET connected in parallel said N-channel MOSFET so as to operate as a CMOS analogue switch and controlled by said second timing signal, and a second N-channel MOSFET connected in parallel to said P-channel MOSFET so as to operate as a CMOS analogue switch and controlled by said first timing signal.

10. A three state input circuit according to claim 9, wherein said first memory means comprises a first data flip-flop circuit which comprises CMOS gates, and said second memory means comprises a second data flip-flop circuit which comprises CMOS gates.

* * * * *